United States Patent [19]

Yamanaka et al.

[11] Patent Number: 4,867,101
[45] Date of Patent: Sep. 19, 1989

[54] APPARATUS FOR PRODUCING MAGNETIC RECORDING MEDIUM

[75] Inventors: Fusao Yamanaka; Makoto Nagao; Akira Nahara, all of Kanagawa, Japan

[73] Assignee: Fuji Photo Film Co., Ltd., Kanagawa, Japan

[21] Appl. No.: 71,941

[22] Filed: Jul. 10, 1987

[30] Foreign Application Priority Data

Jul. 10, 1986 [JP] Japan ................ 61-160893
Aug. 7, 1986 [JP] Japan ................ 61-184321

[51] Int. Cl.$^4$ .................... C23C 16/00; B03C 1/00
[52] U.S. Cl. ............................. 118/718; 118/715; 55/100; 209/215; 209/223.1; 15/DIG. 13
[58] Field of Search .............. 118/715, 718; 55/100; 209/213, 215, 216, 219, 223; 15/DIG. 12, DIG. 13

[56] References Cited

U.S. PATENT DOCUMENTS

| 3,020,177 | 2/1962 | Alexander | 118/718 |
| 4,166,789 | 9/1979 | Imai et al. | 209/219 |
| 4,241,368 | 12/1980 | Tadokoro et al. | 15/DIG. 12 |
| 4,254,585 | 3/1981 | Schoettle et al. | 427/130 |
| 4,378,754 | 4/1983 | Rasekhi et al. | 118/657 |
| 4,380,211 | 4/1983 | Shinohara | 118/718 |
| 4,420,390 | 12/1983 | Carr | 209/216 |
| 4,457,838 | 7/1984 | Carr | 209/223.2 |
| 4,565,591 | 1/1986 | Shannon | 427/47 |
| 4,578,280 | 3/1986 | Greiner et al. | 427/47 |

FOREIGN PATENT DOCUMENTS 59-139137 8/1984 Japan.

Primary Examiner—Norman Morgenstern
Assistant Examiner—Marianne Padgett
Attorney, Agent, or Firm—Sughrue, Mion, Zinn, Macpeak & Seas

[57] ABSTRACT

Contaminant magnetic dust particles and flakes generated during the thin film coating of a substrate 9 in a vacuum chamber 1 are gravitationally collected in catch pans or troughs 8 disposed below the deposition zones. Magnets 10 are provided under the bottoms of the pans to enhance the attraction and retention of the particles. The contaminants may alternatively or additionally be removed directly from an upper surface of the substrate web by sandwiching one or more of its horizontal conveyance runs between a pair of magnets 22, 23, with the pole face area of the lower magnet being larger than that of the upper one.

9 Claims, 1 Drawing Sheet

APPARATUS FOR PRODUCING MAGNETIC RECORDING MEDIUM

BACKGROUND OF THE INVENTION

This invention relates to an apparatus for producing a magnetic recording medium, in which a magnetic film is formed on a substrate by vacuum sputtering, evaporation, etc.

A problem in conventional apparatuses of this type has been the adherence of powder dust and/or condensed flakes generated during the production process on the surface of the substrate and/or the substrate conveying mechanism, and the attendant deterioration in the quality of the magnetic recording medium produced by the apparatus. Japanese Kokai No. 59-139137 attempts to solve this problem by disposing permanent magnets proximate the primary surface of the substrate and its conveying mechanism to attract and thus remove any adhered magnetized dust particles and flakes, but the capture efficiency of the magnets is not sufficiently high. Furthermore, the magnets can only retain a relatively small quantity of dust and flakes before they must be cleaned or restored, which disrupts the continuity of the production process.

SUMMARY OF THE INVENTION

The foregoing problem is effectively overcome in accordance with the present invention by disposing an open topped, troughlike catch pan or chamber in the gravity fall path below a peripheral zone of a rotating drum over which the substrate is fed and whereat the magnetic film is being formed on its exposed surface by vacuum sputtering or evaporation. With such an arrangement any magnetic powders or particles that do not directly adhere to the substrate fall directly into and are retained by the catch pan, such retention preferably being enhanced by disposing a permanent or electromagnet just below the bottom of the pan.

According to another aspect of the invention the N and S poles of magnets are disposed in close proximity to and on opposite sides of the substrate along its path of conveyance to further remove any contaminant particles adhering to the substrate surface, with the magnet on the rear or uncoated side of the substrate having a larger pole face area than the magnet on the principal side.

DETAILED DESCRIPTION OF THE PREFERRED EMBODIMENTS

Figure 1:
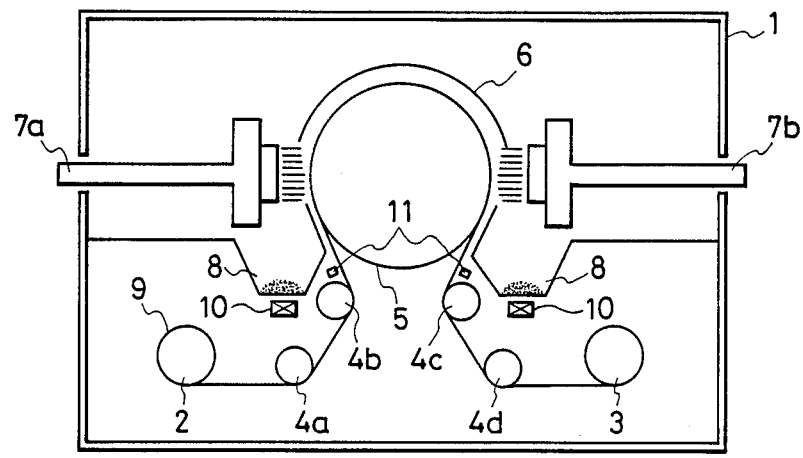
FIG. 1 is a schematic side view of an embodiment of a magnetic recording medium producing apparatus in accordance with the invention.

Referring to the embodiment of the invention illustrated in FIG. 1, a substrate 9 is fed around the outer circumference of a rotary drum 5 disposed in a vacuum chamber 1 via a feed roll 2, guide rolls 4a, 4b, 4c and 4d, and a takeup roll 3. As the substrate passes over the drum a thin magnetic film is sputtered onto its exposed surface from diametrically opposite targets 7a and 7b. Some powder dust generation during the sputtering process is inevitable, and such dust floats or disperses throughout the vacuum chamber. To prevent it from settling onto the surface of the substrate an adhesion proof shield 6 is protectively disposed surrounding the upper surface of the drum and the substrate being borne thereby.

In accordance with the invention catch pans 8 are respectively disposed below each sputtering zone to gravitationally collect the generated powder dust and flakes, and magnets 10 are disposed just under the bottom of each pan to enhance the attraction and retention of the generated particles. The upper or sputtering region of the vacuum chamber is also isolated from the lower or substrate conveying region thereof by shield plates extending inwardly from the sides of the chamber to the respective outer edges of the catch pans, and further isolation is provided by deflection plates extending upwardly at an angle from the inner edges of the catch pans alongside the drum and towards the sputtering zones.

The material of the catch pans is not particularly critical as long as it does not generate any gases which are detrimental to the vacuum deposition process. Acceptable materials include various ceramics, metals and alloys. The strength and polarization of the magnets 10 will be determined by other parameters of the apparatus, and will obviously be chosen to maximize the attraction and retention of the contaminant magnetic particles in the catch pans. Similarly, the precise configuration of the pans will be determined by the overall design of the apparatus, and they will be shaped to provide a sufficient volume or capacity to enable the prolonged operation of the apparatus without the need for frequent shutdowns to empty the pans.

Figure 3:
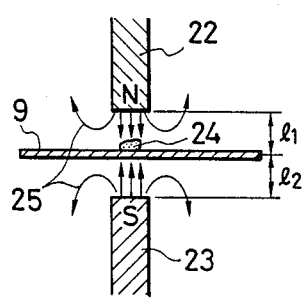
FIG. 3 is a side view for explaining the positional relationship between magnets having their N and S poles disposed on opposite sides of a substrate.

FIG. 3 shows a conventional arrangement for removing magnetized powder dust and flakes 24 from the upper surface of the substrate 9 wherein the respective N and S poles of magnets 22, 23 of equal strength and thus producing substantially equal flux densities are disposed on opposite sides of the substrate conveyance path. For the satisfactory operation of such a magnet arrangement the distance $l_2$ must be greater than the distance $l_1$, however, as the magnetic particles will otherwise be more strongly attracted by the lower magnet 23 and thus remain on the surface of the substrate. While the relationship $l_1 < l_2$ may be initially established during the assembly of the apparatus, it does not remain constant during operation owing to the unavoidable vibration of the substrate during its conveyance, and the particle removal effect of such an arrangement thus tends to become unstable.

Figure 4:
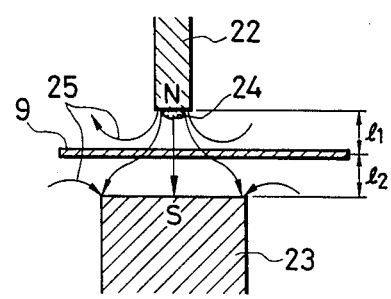
FIG. 4 is a side view similar to that of FIG. 3 but showing an improved construction in accordance with the invention.

This problem is overcome in accordance with the invention by adopting the construction illustrated in FIG. 4, wherein the lower magnet 23, still having substantially the same strength as the upper magnet 22, is provided with a considerably larger pole face than the upper magnet. The attendant spreading of the field gradient as shown by the flux path lines 25 thus ensures that the contaminant magnetic particles 24 are always attracted towards and adhere to the upper magnet 22 even when $l_2 < l_1$. For the satisfactory operation of such a magnet arrangement it is preferable that the total magnetic flux difference between the respective magnets 22, 23 not exceed 20%.

Figure 2:
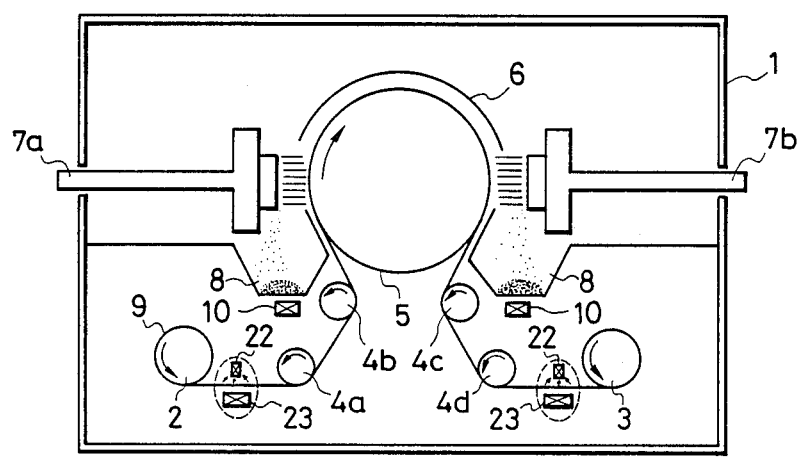
FIG. 2 is a similar schematic side view showing another embodiment of the invention.

FIG. 2 shows a vacuum film forming apparatus similar to that of FIG. 1 and wherein the same reference numerals are used to designate like elements, further provided with the double magnet arrangement of FIG. 4 at both the exit of the feed roll 2 and the entrance of the takeup roll 3. Such a construction provides the additional advantages of initially removing any contaminant magnetic dust particles or flakes from the upper or principal surface of the substrate in preparation for its coating, and of subsequently removing any such particles that may have escaped entrapment by the catch pans before the coated substrate is wound onto the takeup roll.

In a practical construction the upper magnets 22 were made of an Sm-Co alloy (Br, 9700G, with a pole face area of 15 cm$^2$), and the lower magnets 23 were made of ferrite (Sr group, Br, 2000G, with a pole face area of 75 cm$^2$).

It is to be understood that the magnetic particle removal arrangement of FIG. 4 need not be used in conjunction with the catch pans 8 and magnets 10 as shown in FIG. 2, but instead may be used independently.

What is claimed is:

1. An apparatus for forming a thin magnetic film on a surface of a substrate (9), comprising:
   (a) a vacuum chamber (1),
   (b) means within the chamber for conveying a substrate web through a film deposition zone,
   (c) deposition means (7a, 7b) within the chamber for applying a thin magnetic film to an exposed surface of the substrate web at said deposition zone, and
   (d) means within the chamber for attracting and accumulating contaminant magnetic powder dusts and flakes generated by the deposition means pursuant to the application of the film on the substrate web, said attracting and accumulating means comprising:
      (1) an open topped catch pan (8) disposed in a gravity fall path below the film deposition zone, and
      (2) a magnet (10) disposed proximate and below a bottom of the catch and further comprising:
      (3) two pairs of magnets (22, 23) individually disposed at horizontal feed and takeup runs of the substrate web in the conveying region of the chamber,
      (4) each pair comprising an upper magnet (22) having a pole face disposed closely proximate and above the substrate web, and a lower magnet (23) having a pole face disposed closely proximate and below the substrate web, opposite and confronting the upper magnet,
      (5) the pole faces of each pair having opposite polarities, and the pole face area of each lower magnet being substantially larger than the pole face area of each upper magnet.

2. An apparatus according to claim 1, wherein:
   (a) the conveying means includes a rotary drum (5) having a horizontally oriented axis,
   (b) there are two horizontally oriented deposition zones defined on diametrically opposite sides of the drum, and
   (c) there are two catch pans and associated magnets individually disposed below the deposition zones.

3. An apparatus according to claim 2, wherein:
   (a) each catch pan is configured as an elongate trough disposed parallel to the drum,
   (b) a deflection plate extends upwardly from an inner top edge of each trough to a position closely proximate a surface of the drum, and
   (c) a shield plate extends outwardly from an outer top edge of each trough to a side wall of the chamber to isolate an upper deposition region of the chamber from a lower substrate web conveying region thereof.

4. An apparatus for forming a thin magnetic film on a surface of a substrate (9), comprising:
   (a) a vacuum chamber (1),
   (b) means within the chamber for conveying a substrate web through a film deposition zone,
   (c) deposition means (7a, 7b) within the chamber for applying a thin magnetic film to an exposed surface of the substrate web at said deposition zone, and
   (d) means within the chamber for attracting and accumulating contaminant magnetic powder dusts and flakes generated by the deposition means pursuant to the application of the film on the substrate web, said attracting and accumulating means comprising:
      (1) a pair of magnets (22, 23) disposed at a horizontal run of the substrate web in a conveying region of the chamber,
      (2) an upper magnet (22) of said pair having a pole face disposed closely proximate and above the substrate web, and a lower magnet (23) thereof having a pole face disposed closely proximate and below the substrate web, opposite and confronting the upper magnet,
      (3) the pole faces of said magnets having opposite polarities, and the pole face area of the lower magnet being substantially larger than the pole face area of the upper magnet.

5. An apparatus according to claim 4, wherein there are two pairs of said magnets individually disposed at feed and takeup runs of the substrate web.

6. An apparatus according to claim 1, wherein a strength of said each upper magnet is substantially equal to a strength of said each lower magnet, and wherein said each lower magnet is positioned more closely to the web than said each upper magnet.

7. An apparatus according to claim 6, wherein a total magnetic flux difference between said each upper magnet and said each lower magnet is less than or equal to 20%.

8. An apparatus according to claim 4, wherein a strength of each said upper magnet is substantially equal to a strength of each said lower magnet, and wherein each said lower magnet is positioned more closely to the web than each said upper magnet.

9. An apparatus according to claim 8, wherein a total magnetic flux difference between said each upper magnet and said each lower magnet is less than or equal to 20%.

* * * * *